United States Patent
Miyamoto et al.

(10) Patent No.: US 11,337,315 B2
(45) Date of Patent: May 17, 2022

(54) SURFACE TREATED COPPER FOIL, COPPER CLAD LAMINATE, AND PRINTED CIRCUIT BOARD

(71) Applicant: JX Nippon Mining & Metals Corporation, Tokyo (JP)

(72) Inventors: Nobuaki Miyamoto, Ibaraki (JP); Atsushi Miki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 183 days.

(21) Appl. No.: 16/498,032

(22) PCT Filed: Apr. 22, 2019

(86) PCT No.: PCT/JP2019/017093
§ 371 (c)(1),
(2) Date: Sep. 26, 2019

(87) PCT Pub. No.: WO2019/208522
PCT Pub. Date: Oct. 31, 2019

(65) Prior Publication Data
US 2021/0337664 A1    Oct. 28, 2021

(30) Foreign Application Priority Data

Apr. 27, 2018  (JP) .............................. JP2018-087551
Apr. 27, 2018  (JP) .............................. JP2018-087554
(Continued)

(51) Int. Cl.
*H05K 1/09* (2006.01)
*H05K 3/38* (2006.01)
(Continued)

(52) U.S. Cl.
CPC ............. *H05K 3/384* (2013.01); *B32B 15/01* (2013.01); *B32B 15/04* (2013.01); *B32B 15/20* (2013.01);
(Continued)

(58) Field of Classification Search
CPC ....................................................... H05K 1/09
(Continued)

(56) References Cited

U.S. PATENT DOCUMENTS 5,389,446 A    2/1995 Yamanishi et al.
5,456,817 A    10/1995 Hino et al.
(Continued)

FOREIGN PATENT DOCUMENTS

EP    2444530 A1    4/2012
JP    2849059 B2    1/1999
(Continued)

OTHER PUBLICATIONS

International Preliminary Report on Patentability dated Nov. 5, 2020 in co-pending PCT application No. PCT/JP2019/017096.
(Continued)

*Primary Examiner* — Stanley Tso
(74) *Attorney, Agent, or Firm* — Nields, Lemack & Frame, LLC (57) ABSTRACT

A surface treated copper foil 1 includes a copper foil 2, and a first surface treatment layer 3 formed on one surface of the copper foil 2. The first surface treatment layer 3 of the surface treated copper foil 1 has L* of a CIE L*a*b* color space of 44.0 to 84.0. A copper clad laminate 10 includes the surface treated copper foil 1 and an insulating substrate 11 adhered to a surface of the surface treated copper foil 1 opposite to the first surface treatment layer 3.

8 Claims, 2 Drawing Sheets

(30) Foreign Application Priority Data

May 31, 2018 (JP) .............................. JP2018-105116
Jul. 19, 2018 (JP) .............................. JP2018-136096

(51) Int. Cl.

| | |
|---|---|
| C25D 5/00 | (2006.01) |
| C25D 5/12 | (2006.01) |
| B32B 15/04 | (2006.01) |
| B32B 15/20 | (2006.01) |
| H05K 3/02 | (2006.01) |
| H05K 3/06 | (2006.01) |
| B32B 15/01 | (2006.01) |
| C22C 9/04 | (2006.01) |
| C25D 5/14 | (2006.01) |
| C25D 3/04 | (2006.01) |
| C25D 3/12 | (2006.01) |
| C25D 3/38 | (2006.01) |
| C25D 3/56 | (2006.01) |
| C25D 11/38 | (2006.01) |

(52) U.S. Cl.

CPC ................ *C22C 9/04* (2013.01); *C25D 5/12* (2013.01); *C25D 5/605* (2020.08); *C25D 5/627* (2020.08); *H05K 1/09* (2013.01); *H05K 3/022* (2013.01); *H05K 3/06* (2013.01); *B32B 2307/206* (2013.01); *B32B 2457/08* (2013.01); *C25D 3/04* (2013.01); *C25D 3/12* (2013.01); *C25D 3/38* (2013.01); *C25D 3/562* (2013.01); *C25D 5/14* (2013.01); *C25D 11/38* (2013.01); *H05K 2201/0338* (2013.01); *H05K 2201/0355* (2013.01); *H05K 2203/0307* (2013.01)

(58) Field of Classification Search

USPC ........................................................ 174/257
See application file for complete search history.

(56) References Cited

U.S. PATENT DOCUMENTS

| | | | |
|---|---|---|---|
| 5,552,234 A | 9/1996 | Kawasumi | |
| 6,319,621 B1 | 11/2001 | Arai et al. | |
| 8,142,905 B2 | 3/2012 | Moriyama et al. | |
| 2002/0053517 A1 | 5/2002 | Endo et al. | |
| 2002/0182433 A1 | 12/2002 | Endo | |
| 2003/0031888 A1 | 2/2003 | Kitano et al. | |
| 2004/0191560 A1 | 9/2004 | Matsuda et al. | |
| 2010/0212941 A1 | 8/2010 | Higuchi | |
| 2010/0261033 A1 | 10/2010 | Moriyama et al. | |
| 2011/0189501 A1 | 8/2011 | Fujisawa et al. | |
| 2011/0259848 A1 | 10/2011 | Yamanishi et al. | |
| 2011/0262764 A1 | 10/2011 | Arai et al. | |
| 2011/0284496 A1 | 11/2011 | Yamanishi et al. | |
| 2011/0293960 A1 | 12/2011 | Yamanishi et al. | |
| 2011/0297641 A1 | 12/2011 | Yamanishi et al. | |
| 2011/0300401 A1 | 12/2011 | Yamanishi et al. | |
| 2012/0135266 A1 | 5/2012 | Kaminaga | |
| 2012/0148862 A1 | 6/2012 | Moriyama et al. | |
| 2012/0276412 A1 | 11/2012 | Miki | |
| 2013/0011690 A1 | 1/2013 | Arai et al. | |
| 2013/0040162 A1 | 2/2013 | Fujisawa et al. | |
| 2014/0016348 A1 | 1/2014 | Iwasaki | |
| 2014/0057123 A1 | 2/2014 | Arai et al. | |
| 2014/0093743 A1 | 4/2014 | Arai et al. | |
| 2014/0146454 A1 | 5/2014 | Nozawa | |
| 2014/0355229 A1 | 12/2014 | Arai et al. | |
| 2015/0008020 A1* | 1/2015 | Kaneko .................. | H05K 3/465 174/257 |
| 2015/0047884 A1 | 2/2015 | Nagaura et al. | |
| 2015/0079415 A1 | 3/2015 | Fukuchi | |
| 2015/0237737 A1 | 8/2015 | Arai et al. | |
| 2015/0245477 A1 | 8/2015 | Arai et al. | |
| 2016/0189986 A1 | 6/2016 | Kasai et al. | |
| 2016/0242281 A1 | 8/2016 | Nagaura et al. | |
| 2016/0286665 A1 | 9/2016 | Arai et al. | |
| 2016/0303829 A1 | 10/2016 | Arai et al. | |
| 2016/0374205 A1* | 12/2016 | Moriyama ............. | H05K 3/025 |
| 2017/0032978 A1 | 2/2017 | Moriyama et al. | |
| 2017/0034926 A1 | 2/2017 | Moriyama et al. | |
| 2017/0144355 A1 | 5/2017 | Kuwabara et al. | |
| 2017/0336535 A1 | 11/2017 | Shima et al. | |
| 2018/0160529 A1 | 6/2018 | Arai et al. | |
| 2018/0226655 A1 | 8/2018 | Arai et al. | |
| 2018/0228029 A1 | 8/2018 | Moriyama | |
| 2018/0255646 A1 | 9/2018 | Moriyama | |
| 2018/0288867 A1 | 10/2018 | Fukuchi | |
| 2019/0145014 A1 | 5/2019 | Chen et al. | |
| 2021/0331449 A1 | 10/2021 | Miyamoto et al. | |
| 2021/0360785 A1 | 11/2021 | Miyamoto et al. | |
| 2021/0362475 A1 | 11/2021 | Miyamoto et al. | |

FOREIGN PATENT DOCUMENTS

| | | | |
|---|---|---|---|
| JP | 2011-9267 A | | 1/2011 |
| JP | 5204908 B1 | | 6/2013 |
| JP | 2016-010961 A | | 1/2016 |
| KR | 2012-0135197 A | | 12/2012 |
| PH | 12014000344 A1 | | 6/2016 |
| TW | I422484 B | | 1/2014 |
| TW | 201526726 | * | 7/2015 |
| TW | I530234 B | | 4/2016 |
| TW | 201619448 A | | 6/2016 |
| TW | I619409 B | | 3/2018 |
| WO | 2010/074053 A1 | | 7/2010 |
| WO | 2010/074061 A1 | | 7/2010 |
| WO | 2010/074072 A1 | | 7/2010 |
| WO | 2010/147013 A1 | | 12/2010 |
| WO | 2011/105318 A1 | | 9/2011 |
| WO | 2016/035604 A1 | | 3/2016 |
| WO | 2016/038923 A1 | | 3/2016 |
| WO | 2017/006739 A1 | | 1/2017 |

OTHER PUBLICATIONS

International Preliminary Report on Patentability dated Nov. 5, 2020 in co-pending PCT application No. PCT/JP2019/017092.
International Preliminary Report on Patentability dated Nov. 5, 2020 in co-pending PCT application No. PCT/JP2019/017091.
International Preliminary Report on Patentability dated Nov. 5, 2020 in corresponding PCT application No. PCT/JP2019/017093.
International Search Report dated Jun. 11, 2019 in co-pending PCT application No. PCT/JP2019/017096.
International Search Report dated Jun. 11, 2019 in co-pending PCT application No. PCT/JP2019/017092.
International Search Report dated Jun. 11, 2019 in co-pending PCT application No. PCT/JP2019/017091.
International Search Report dated Jun. 11, 2019 in corresponding PCT application No. PCT/JP2019/017093.
Office action dated Sep. 28, 2021 in co-pending U.S. Appl. No. 16/497,996.
Office action dated Oct. 13, 2021 in co-pending U.S. Appl. No. 16/498,003.
Korean communication, with English translation, dated Oct. 26, 2021 in co-pending Korean patent application No. 10-2020-7029313.
European communication dated Dec. 7, 2021 in co-pending European patent application No. 19793376.5.
Office action dated Oct. 22, 2021 in co-pending U.S. Appl. No. 16/498,010.
Final rejection dated Jan. 21, 2022 in co-pending U.S. Appl. No. 16/498,010.
Notice of Allowance dated Feb. 7, 2022 in co-pending U.S. Appl. No. 16/497,996.
Final rejection dated Jan. 31, 2022 in co-pending U.S. Appl. No. 16/498,003.

* cited by examiner

SURFACE TREATED COPPER FOIL, COPPER CLAD LAMINATE, AND PRINTED CIRCUIT BOARD

TECHNICAL FIELD

The present disclosure relates to a surface treated copper foil, a copper clad laminate, and a printed circuit board.

BACKGROUND ART

Associated with the increase of needs in electronic devices, such as reduction in size and enhancement of capability, in recent years, there has been a demand of reduction in pitch (miniaturization) of a circuit pattern (which may be referred to as a conductor pattern) of a printed circuit board mounted on the electronic devices.

Various methods, such as a subtractive method and a semi-additive method, have been known as a production method of the printed circuit board. In the subtractive method among these, an insulating substrate is adhered to a copper foil to form a copper clad laminate, then a resist is coated on the surface of the copper foil and then exposed to form a prescribed resist pattern, and the portion having no resist pattern formed (i.e., the unnecessary portion) is removed by etching, so as to form a circuit pattern.

For addressing the needs of reduction in pitch described above, for example, PTL 1 describes that the surface of a copper foil is subjected to a roughening treatment through copper-cobalt-nickel alloy plating, on which a cobalt-nickel alloy plated layer is then formed, and a zinc-nickel alloy plated layer is further formed thereon, so as to provide a surface treated copper foil that is capable of achieving the reduction in pitch of the circuit pattern.

CITATION LIST

Patent Literature

PTL 1: Japanese Patent No. 2,849,059

SUMMARY OF INVENTION

Technical Problem

An electronic component is generally mounted on a circuit pattern through soldering, and however, due to the reduction pitch of the circuit pattern, the bonding reliability thereof to an electronic component is becoming difficult to secure. In particular, a circuit pattern may be melted in soldering in some cases, and it is the current situation that the soldering heat resistance cannot be said to be sufficient. Furthermore, while lead-free solder is being frequently used in consideration of the environmental issues, lead-free solder has a higher reflow temperature than tin-lead eutectic solder. This is also one of the factors of the demand of soldering heat resistance.

One or more embodiments of the present application have been made for solving the aforementioned problem, and an object thereof is to provide a surface treated copper foil and a copper clad laminate that are capable of forming a circuit pattern excellent in soldering heat resistance.

Another object of one or more embodiments of the present application is to provide a printed circuit board that has a circuit pattern excellent in soldering heat resistance.

Solution to Problem

The present inventors have made earnest investigations for solving the problem, and as a result, have found that the soldering heat resistance of a circuit pattern can be enhanced in such a manner that on a surface treatment layer formed on one surface of a copper foil, L* of a CIE L*a*b* color space is controlled to a particular range, and thus one or more embodiments of the present application have been completed.

Accordingly, one or more embodiments of the present application relate to a surface treated copper foil including a copper foil, and a first surface treatment layer formed on one surface of the copper foil, wherein the first surface treatment layer has L* of a CIE L*a*b* color space of 44.0 to 84.0.

One or more embodiments of the present application also relate to a copper clad laminate including the surface treated copper foil and an insulating substrate adhered to a surface of the surface treated copper foil opposite to the first surface treatment layer.

One or more embodiments of the present application also relate to a printed circuit board including a circuit pattern formed by etching the surface treated copper foil of the copper clad laminate.

Advantageous Effects of Invention

According to one or more embodiments of the present application, a surface treated copper foil and a copper clad laminate that are capable of forming a circuit pattern excellent in soldering heat resistance can be provided.

According to one or more embodiments of the present application, a printed circuit board that has a circuit pattern excellent in soldering heat resistance can also be provided.

DESCRIPTION OF EMBODIMENTS

One or more preferred embodiments of the present application will be specifically described below, but the one or more embodiments of the present application are not limited thereto and may be subjected to various changes and improvements by a skilled person in the art unless the changes and improvements deviate the one or more embodiments of the present application. The plural constitutional elements described in the one or more embodiments may form various inventions through appropriate combinations thereof. For example, some of the constitutional elements may be deleted from all the constitutional elements shown in the one or more embodiments, and the constitutional elements of other one or more embodiments may be appropriately combined therewith.

Embodiment 1

Figure 1:
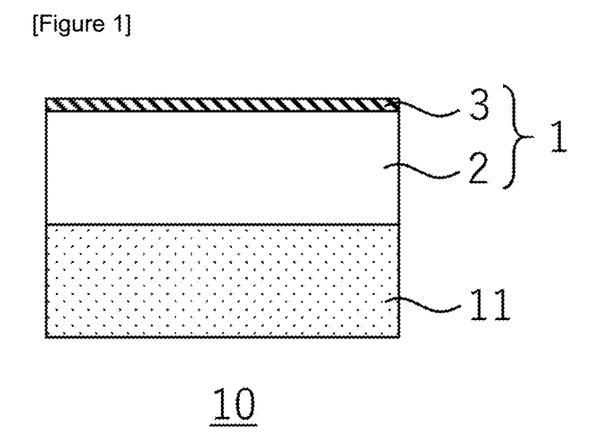
FIG. 1 is a cross sectional view showing a copper clad laminate using a surface treated copper foil of the embodiment 1 of the present application.

FIG. 1 is a cross sectional view showing a copper clad laminate using a surface treated copper foil of the embodiment 1 of the present application.

As shown in FIG. 1, the surface treated copper foil 1 has a copper foil 2, and a first surface treatment layer 3 formed on one surface of the copper foil 2. The copper clad laminate 10 has the surface treated copper foil 1 and an insulating substrate 11 adhered to a surface of the surface treated copper foil 1 opposite to the first surface treatment layer 3.

The first surface treatment layer 3 has L* of a CIE L*a*b* color space measured according to the geometric condition C of JIS Z8730:2009 (which may be hereinafter referred to as "L*") of 44.0 to 84.0. L* is an index of monochromaticity, and has a relationship to the amount of Zn influencing the heat resistance in addition to the surface roughness. Therefore, by controlling L* to the range, the soldering heat resistance of the circuit pattern formed from the surface treated copper foil 1 can be enhanced. From the standpoint of the more stable enhancement of the soldering heat resistance, L* is preferably controlled to 74.0 to 84.0.

The kind of the first surface treatment layer 3 is not particularly limited, as far as the L* is in the aforementioned range, and various surface treatment layers having been known in this field of art may be used. Examples of the surface treatment layer used as the first surface treatment layer 3 include a heat resistant layer, a rust preventing layer, a chromate treatment layer, and a silane coupling treatment layer. These layers may be used solely or as a combination of two or more kinds thereof. Among these, the first surface treatment layer 3 preferably includes a heat resistant layer and a rust preventing layer from the standpoint of the soldering heat resistance.

The heat resistant layer and the rust preventing layer are not particularly limited, and may be formed of materials having been known in this field of art. The heat resistant layer may function as the rust preventing layer in some cases, and therefore, one layer having both the functions of the heat resistant layer and the rust preventing layer may be formed as the heat resistant layer and the rust preventing layer.

The heat resistant layer and/or the rust preventing layer may be a layer that contains at least one element (which may be in the form of any of a metal, an alloy, an oxide, a nitride, a sulfide, and the like) selected from the group consisting of nickel, zinc, tin, cobalt, molybdenum, copper, tungsten, phosphorus, arsenic, chromium, vanadium, titanium, aluminum, gold, silver, a platinum group element, iron, and tantalum. Examples of the heat resistant layer and/or the rust preventing layer include a layer containing a nickel-zinc alloy.

The heat resistant layer and the rust preventing layer may be formed through electroplating, the condition for which is not particularly limited, and the condition for a typical heat resistant layer (Ni—Zn layer) may be as follows.

Plating solution composition: 1 to 30 g/L of Ni and 1 to 30 g/L of Zn
Plating solution pH: 2.0 to 5.0
Plating solution temperature: 30 to 50° C.
Electroplating condition: current density of 1 to 10 A/dm$^2$ and a time of 0.1 to 5 seconds The chromate treatment layer is not particularly limited, and may be formed of materials having been known in this field of art.

In the description herein, the "chromate treatment layer" means a layer that is formed with a solution containing chromic anhydride, chromic acid, dichromic acid, a chromate salt, or a dichromate salt. The chromate treatment layer may be a layer that contains an element (which may be in the form of any of a metal, an alloy, an oxide, a nitride, a sulfide, and the like) of cobalt, iron, nickel, molybdenum, zinc, tantalum, copper, aluminum, phosphorus, tungsten, tin, arsenic, titanium, or the like. Examples of the chromate treatment layer include a chromate treatment layer that is formed by treating with a chromic anhydride or potassium dichromate aqueous solution, and a chromate treatment layer that is formed by treating with a treatment solution containing chromic anhydride or potassium dichromate, and zinc.

The chromate treatment layer may be formed by a dip chromate treatment. The condition therefor is not particularly limited, and the condition for a typical chromate treatment layer is as follows.

Chromate solution composition: 1 to 10 g/L of $K_2Cr_2O_7$ and 0.01 to 10 g/L of Zn
Chromate solution pH: 2.0 to 5.0
Chromate solution temperature: 30 to 50° C.

The silane coupling treatment layer is not particularly limited, and may be formed of materials having been known in this field of art.

In the description herein, the "silane coupling treatment layer" means a layer that is formed with a silane coupling agent.

The silane coupling agent is not particularly limited, and materials having been known in this field of art may be used. Examples of the silane coupling agent include an amino silane coupling agent, an epoxy silane coupling agent, a mercapto silane coupling agent, a methacryloxy silane coupling agent, a vinyl silane coupling agent, an imidazole silane coupling agent, and a triazine silane coupling agent. Among these, an amino silane coupling agent and an epoxy silane coupling agent are preferred. The silane coupling agent may be used solely or as a combination of two or more kinds thereof.

The silane coupling agent may be produced by a known method, and a commercially available product may also be used. Examples of the commercially available product that can be used as the silane coupling agent include KBM Series and KBE Series, produced by Shin-Etsu Chemical Co., Ltd. The commercially available product of the silane coupling agent may be used solely, and from the standpoint of the adhesion (peel strength) between the first surface treatment layer 3 and the insulating substrate 11, a mixture of two or more kinds of the silane coupling agents is preferably used. Examples of the preferred mixture of silane coupling agents among these include a mixture of KBM 603 (N-2-(aminoethyl)-3-aminopropyltrimethoxysilane) and KBM 503 (3-methacryloxypropyltrimethoxysilane), a mixture of KBM 602 (N-2-(aminoethyl)-3-aminopropyldimethoxysilane) and KBM 503 (3-methacryloxypropyltrimethoxysilane), a mixture of KBM 603 (N-2-(aminoethyl)-3-aminopropyltrimethoxysilane) and KBE 503 (3-methacryloxypropyltriethoxysilane), a mixture of KBM 602 (N-2-(aminoethyl)-3-aminopropyldimethoxysilane) and KBE 503 (3-methacryloxypropyltriethoxysilane), a mixture of KBM 903 (3-aminopropyltrimethoxysilane) and KBM 503 (3-methacryloxypropyltrimethoxysilane), a mixture of KBE 903 (3-aminotriethoxysilane) and KBM 503 (3-methacryloxypropyltrimethoxysilane), a mixture of KBE 903 (3-aminotriethoxysilane) and KBE 503 (3-methacryloxypropyltriethoxysilane), and a mixture of KBM 903 (3-aminopropyltrimethoxysilane) and KBE 503 (3-methacryloxypropyltriethoxysilane).

In the case where a mixture of two or more kinds of the silane coupling agents is used, the mixing ratio thereof is not particularly limited and may be appropriately controlled depending on the kinds of the silane coupling agents used.

The first surface treatment layer 3 preferably contains elements, such as Zn, Cr, and Ni, as deposited elements.

The deposited amount of Zn of the first surface treatment layer 3 is not particularly limited since the deposited amount thereof depends on the kind of the first surface treatment layer 3, and in the case where the first surface treatment layer 3 contains Zn, the deposited amount is preferably from 200 to 600 μg/dm$^2$, more preferably from 230 to 550 μg/dm$^2$, and further preferably from 250 to 500 μg/dm$^2$. By controlling the deposited amount of Zn of the first surface treatment layer 3 to the range, the effects including the heat resistance and the chemical resistance can be obtained, and the etching factor of the circuit pattern can be enhanced.

The deposited amount of Cr of the first surface treatment layer 3 is not particularly limited since the deposited amount thereof depends on the kind of the first surface treatment layer 3, and in the case where the first surface treatment layer 3 contains Cr, the deposited amount is preferably 10 μg/dm$^2$ or more, more preferably from 15 to 300 μg/dm$^2$, and further preferably from 20 to 100 μg/dm$^2$. By controlling the deposited amount of Cr of the first surface treatment layer 3 to the range, a rust preventing effect can be obtained, and simultaneously the etching factor of the circuit pattern can be enhanced.

The deposited amount of Ni of the first surface treatment layer 3 is not particularly limited since the deposited amount thereof depends on the kind of the first surface treatment layer 3, and in the case where the first surface treatment layer 3 contains Ni, the deposited amount is preferably from 30 to 200 μg/dm$^2$, more preferably from 35 to 170 μg/dm$^2$, and further preferably from 40 to 150 μg/dm$^2$. By controlling the deposited amount of Ni of the first surface treatment layer 3 to the range, the etching factor of the circuit pattern can be stably enhanced.

The copper foil 2 is not particularly limited, and may be either an electrolytic copper foil or a rolled copper foil. An electrolytic copper foil is generally produced by electrolytically depositing copper from a copper sulfate plating bath onto a titanium or stainless steel drum, and has a flat S surface (shine surface) formed on the side of the drum and an M surface (matt surface) on the opposite side to the S surface. In general, the M surface of the electrolytic copper foil has irregularity, and the adhesion between the opposite surface to the first surface treatment layer 3 and the insulating substrate 11 can be enhanced by making the opposite surface to the first surface treatment layer 3 as the M surface of the electrolytic copper foil.

The material of the copper foil 2 is not particularly limited, and in the case where the copper foil 2 is a rolled copper foil, high purity copper that is generally used as a circuit pattern of a printed circuit board, such as tough pitch copper (JIS H3100, alloy number: C1100) and oxygen-free copper (JIS H3100, alloy number: C1020, or JIS H3510, alloy number: C1011), may be used. Furthermore, for example, copper alloys, such as Sn-containing copper, Ag-containing copper, a copper alloy containing Cr, Zr, or Mg, and a Corson copper alloy containing Ni and Si, may also be used. In the description herein, the "copper foil 2" is a concept including a copper alloy foil.

The thickness of the copper foil 2 is not particularly limited, and may be, for example, from 1 to 1,000 μm, or from 1 to 500 μm, or from 1 to 300 μm, or from 3 to 100 μm, or from 5 to 70 μm, or from 6 to 35 μm, or from 9 to 18 μm.

The surface treated copper foil 1 having the aforementioned structure may be produced according to a method having been known in this field of art. L* of the first surface treatment layer 3 can be controlled, for example, by changing the kind, the thickness, and the like of the surface treatment layer formed.

The copper clad laminate 10 can be produced by adhering the insulating substrate 11 to a surface of the surface treated copper foil 1 opposite to the first surface treatment layer 3.

The insulating substrate 11 is not particularly limited, and materials having been known in this field of art may be used. Examples of the insulating substrate 11 include a paper base impregnated with a phenol resin, a paper base impregnated with an epoxy resin, a synthetic fiber base impregnated with an epoxy resin, a glass cloth-paper composite base impregnated with an epoxy resin, a glass cloth-glass nonwoven cloth composite base impregnated with an epoxy resin, a glass cloth base impregnated with an epoxy resin, a polyester film, a polyimide film, and a substrate formed of a liquid crystal polymer, a fluorine resin, or the like.

The adhesion method of the surface treated copper foil 1 and the insulating substrate 11 is not particularly limited, and the adhesion may be performed by a method having been known in this field of art. For example, the surface treated copper foil 1 and the insulating substrate 11 may be laminated and subjected to thermocompression bonding.

Embodiment 2

Figure 2:
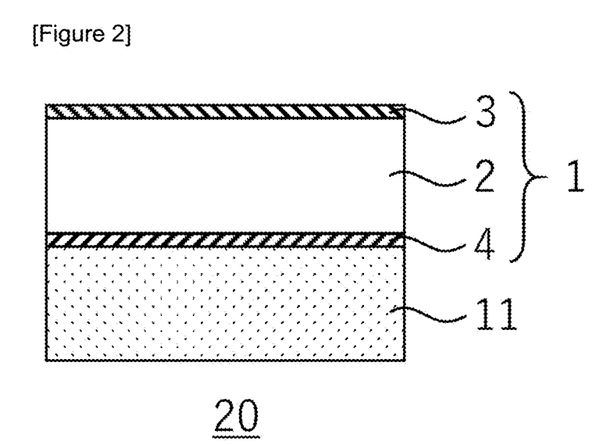
FIG. 2 is a cross sectional view showing a copper clad laminate using a surface treated copper foil of the embodiment 2 of the present application.

FIG. 2 is a cross sectional view showing a copper clad laminate using a surface treated copper foil of the embodiment 2 of the present application.

As shown in FIG. 2, the surface treated copper foil 1 of the embodiment 2 of the present application is different from the surface treated copper foil 1 of the embodiment 1 of the present application in the point that a second surface treatment layer 4 is further provided on the opposite surface of the copper foil 2. The copper clad laminate 20 of the embodiment 2 of the present application is different from the copper clad laminate 10 of the embodiment 1 of the present application in the point that the insulating substrate 11 is adhered to the second surface treatment layer 4 of the surface treated copper foil 1. In the following description, only the points that are different from the surface treated copper foil 1 and the copper clad laminate 10 of the embodiment 1 of the present application will be described, and the explanation of the same points will be omitted.

The kind of the second surface treatment layer 4 is not particularly limited, and various surface treatment layers having been known in this field of art may be used. Examples of the surface treatment layer used as the second surface treatment layer 4 include a roughening treatment layer, a heat resistant layer, a rust preventing layer, a chromate treatment layer, and a silane coupling treatment layer. These layers may be used solely or as a combination of two or more kinds thereof. Among these, the second surface treatment layer 4 preferably includes a roughening treatment layer from the standpoint of the adhesion to the insulating substrate 11.

In the description herein, the "roughening treatment layer" is a layer that is formed through a roughening treatment, and includes a layer of roughening particles. In the roughening treatment, there are some cases where ordinary copper plating or the like may be performed as a pretreatment thereof, and ordinary copper plating or the like may be performed as a finishing treatment for preventing the roughening particles from dropping off, and the "roughening treatment layer" in the description herein includes the layers formed through the pretreatment and the finishing treatment.

The roughening particles are not particularly limited, and may be formed of an elemental substance selected from the group consisting of copper, nickel, cobalt, phosphorus, tungsten, arsenic, molybdenum, chromium, and zinc, or an alloy containing at least one thereof. After forming the roughening particles, a roughening treatment may further be performed by providing secondary particles or tertiary particles formed of an elemental substance or an alloy of nickel, cobalt, copper, or zinc, or the like.

The roughening treatment layer may be formed through electroplating, the condition for which is not particularly limited, and the condition may be typically as follows. The electroplating may be performed by dividing into two stages.

Plating solution composition: 10 to 20 g/L of Cu and 50 to 100 g/L of sulfuric acid Plating solution temperature: 25 to 50° C.

Electroplating condition: current density of 1 to 60 A/dm$^2$ and a time of 1 to 10 seconds The second surface treatment layer 4 preferably contains elements, such as Ni, Zn, Co, and Cr, as deposited elements.

Ni is a component that is hardly soluble in the etching solution, and therefore, by controlling the deposited amounts of Ni of the second surface treatment layer 4 to 200 μg/dm$^2$ or less, the second surface treatment layer 4 becomes readily soluble in the etching solution. As a result, the etching factor of the circuit pattern can be enhanced. From the standpoint of the stable enhancement of the etching factor, the deposited amount of Ni of the second surface treatment layer 4 is preferably controlled to 180 μg/dm$^2$ or less, and more preferably 100 μg/dm$^2$ or less. From the standpoint of the securement of the prescribed effects (such as the heat resistance) by the second surface treatment layer 4, the deposited amount of Ni of the second surface treatment layer 4 may be controlled to 20 μg/dm$^2$ or more.

Zn is readily soluble in the etching solution, and therefore, a relatively large amount thereof may be deposited. Accordingly, by controlling the deposited amount of Zn of the second surface treatment layer 4 to 1,000 μg/dm$^2$ or less, the second surface treatment layer 4 becomes readily soluble. As a result, the etching factor of the circuit pattern can be enhanced. From the standpoint of the stable enhancement of the etching factor, the deposited amount of Zn of the second surface treatment layer 4 is preferably controlled to 700 μg/dm$^2$ or less, and more preferably controlled to 600 μg/dm$^2$ or less. From the standpoint of the securement of the prescribed effects (such as the heat resistance and the chemical resistance) by the second surface treatment layer 4, the deposited amount of Zn of the second surface treatment layer 4 may be controlled to 20 μg/dm$^2$ or more, preferably 100 μg/dm$^2$ or more, and more preferably 300 μg/dm$^2$ or more.

The deposited amount of Co of the second surface treatment layer 4 is not particularly limited since the deposited amount thereof depends on the kind of the second surface treatment layer 4, and is preferably 1,500 μg/dm$^2$ or less, more preferably 500 μg/dm$^2$ or less, further preferably 100 μg/dm$^2$ or less, and particularly preferably 30 μg/dm$^2$ or less. By controlling the deposited amount of Co of the second surface treatment layer 4 to the range, the etching factor of the circuit pattern can be stably enhanced. The lower limit of the deposited amount of Co is not particularly limited, and is typically 0.1 μg/dm$^2$, and is preferably 0.5 μg/dm$^2$.

Since Co is a magnetic metal, the surface treated copper foil 1 that is capable of producing a printed circuit board excellent in high frequency characteristics can be obtained by suppressing the deposited amount of Co of the second surface treatment layer 4 particularly to 100 μg/dm$^2$ or less, and preferably 0.5 to 100 μg/dm$^2$.

The deposited amount of Cr of the second surface treatment layer 4 is not particularly limited since the deposited amount thereof depends on the kind of the second surface treatment layer 4, and is preferably 500 μg/dm$^2$ or less, more preferably from 0.5 to 300 μg/dm$^2$, and further preferably from 1 to 100 μg/dm$^2$. By controlling the deposited amount of Cr of the second surface treatment layer 4 to the range, a rust preventing effect can be obtained, and simultaneously the etching factor of the circuit pattern can be stably enhanced.

The ratio of the deposited amount of Ni of the second surface treatment layer 4 to the deposited amount of Ni of the first surface treatment layer 3 is preferably from 0.01 to 2.5, and more preferably from 0.6 to 2.2. Ni is a component that is hardly soluble in the etching solution, and therefore, by controlling the ratio of the deposited amounts of Ni to the range, the dissolution of the second surface treatment layer 4 becoming the bottom of the circuit pattern can be enhanced, and the dissolution of the first surface treatment layer 3 becoming the top of the circuit pattern can be suppressed, in etching the copper clad laminate 20. Accordingly, a circuit pattern that has a small difference between the top width and the bottom width and has a high etching factor can be provided.

Sa of the second surface treatment layer 4 is not particularly limited, and is preferably from 0.05 to 0.40 μm, and more preferably from 0.10 to 0.30 μm. By controlling Sa of the second surface treatment layer 4 to the range, the adhesion to the insulating substrate 11 can be enhanced.

In the description herein, "Sa" means a surface roughness Sa measured according to ISO-25178-2:2012.

Embodiment 3

The printed circuit board of the embodiment 3 of the present application includes a circuit pattern formed by etching the surface treated copper foil 1 of the copper clad laminate of the embodiment 1 or 2.

While the production method of the printed circuit board is not particularly limited, and a known method, such as a subtractive method and a semi-additive method, may be used, a subtractive method is preferably used.

Figure 3:
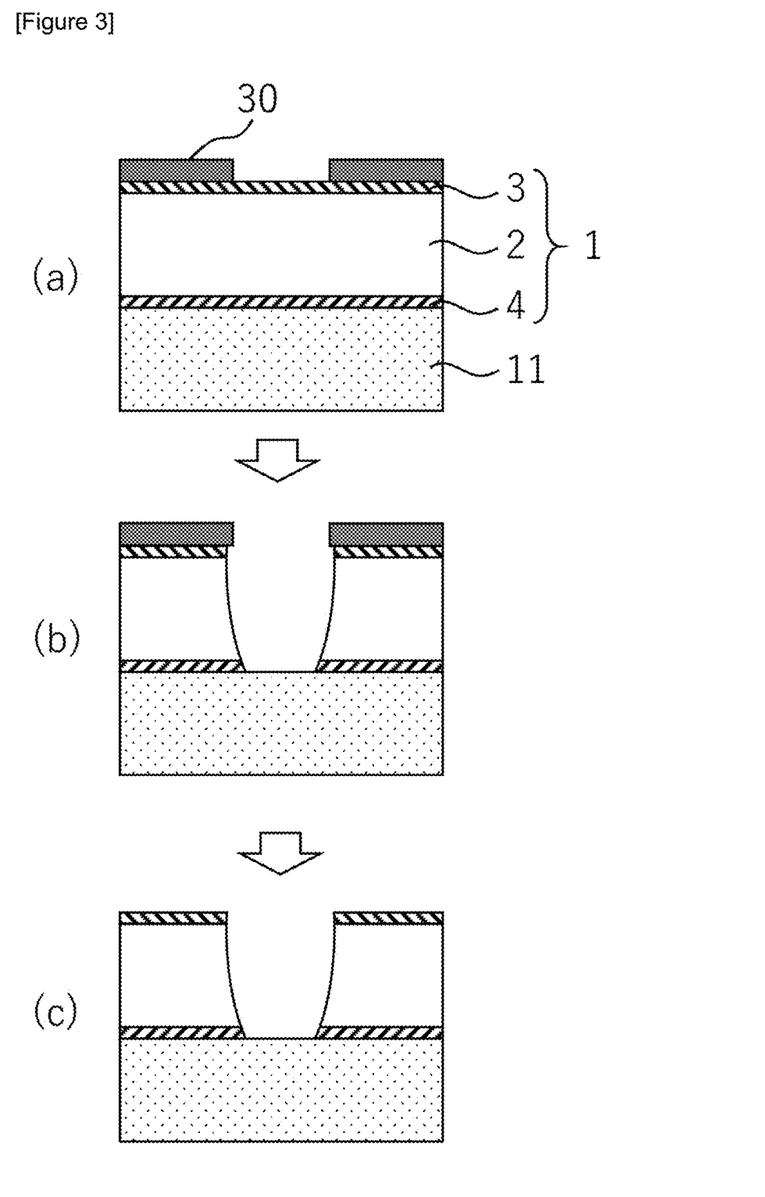
FIG. 3 is a cross sectional view showing a production method of a printed circuit board of the embodiment 3 of the present application.

FIG. 3 is a cross sectional view showing a production method of the printed circuit board of the embodiment 3 of the present application.

In FIG. 3, firstly, a resist is coated on the surface of the surface treated copper foil 1 of the copper clad laminate 10, and then exposed and developed to form a prescribed resist pattern 30 (step (a)). Subsequently, the surface treated copper foil 1 on the portion having no resist pattern 30 formed (i.e., the unnecessary portion) is removed by etching (step (b)). Finally, the resist pattern 30 on the surface treated copper foil 1 is removed (step (c)).

The conditions in the subtractive method are not particularly limited, and the method may be performed under conditions having been known in this field of art.

EXAMPLES

One or more embodiments of the present application will be described more specifically with reference to examples below, but one or more embodiments of the present application are not limited to the examples.

Example 1

A rolled copper foil having a thickness of 12 μm (HA-V2 Foil, produced by JX Nippon Mining & Metals Corporation) was prepared. On one surface of the copper foil, a roughening treatment layer, a heat resistant layer, and a chromate treatment layer, were serially formed as the second surface treatment layer, and on the other surface, a heat resistant layer and a chromate treatment layer were serially formed as the first surface treatment layer, so as to provide a surface treated copper foil. The conditions for forming the layers were as follows.

<Heat Resistant Layer of First Surface Treatment Layer>

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 2.8 A/dm$^2$ and a time of 0.7 second <Chromate Treatment Layer of First Surface Treatment Layer>

The chromate treatment layer was formed by a dip chromate treatment.

Chromate solution composition: 3.0 g/L of $K_2Cr_2O_7$ and 0.33 g/L of Zn

Chromate solution pH: 3.6

Chromate solution temperature: 50° C.

<Roughening Treatment Layer of Second Surface Treatment Layer>

The roughening treatment layer was formed by electroplating. The electroplating was performed by dividing to two stages.

(Condition for First Stage)

Plating solution composition: 11 g/L of Cu and 50 g/L of sulfuric acid

Plating solution temperature: 25° C.

Electroplating condition: current density of 42.7 A/dm$^2$ and a time of 1.4 seconds (Condition for Second Stage)

Plating solution composition: 20 g/L of Cu and 100 g/L of sulfuric acid

Plating solution temperature: 50° C.

Electroplating condition: current density of 3.8 A/dm$^2$ and a time of 2.8 seconds <Heat Resistant Layer of Second Surface Treatment Layer>

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 1.6 A/dm$^2$ and a time of 0.7 second <Chromate Treatment Layer of Second Surface Treatment Layer>

The chromate treatment layer was formed by electroplating.

Plating solution composition: 3.0 g/L of $K_2Cr_2O_7$ and 0.33 g/L of Zn

Plating solution pH: 3.6

Plating solution temperature: 50° C.

Electroplating condition: current density of 2.1 A/dm$^2$ and a time of 1.4 seconds Example 2

A surface treated copper foil was obtained in the same manner as in Example 1 except that the formation condition of the heat resistant layer of the second surface treatment layer was changed as follows.

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 2.6 A/dm$^2$ and a time of 0.7 second Example 3

A surface treated copper foil was obtained in the same manner as in Example 1 except that the formation condition of the heat resistant layer of the second surface treatment layer was changed as follows.

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 4.2 A/dm$^2$ and a time of 0.7 second Example 4

A surface treated copper foil was obtained in the same manner as in Example 1 except that the formation conditions of the heat resistant layers of the first surface treatment layer and the second surface treatment layer were changed as follows.

<Heat Resistant Layer of First Surface Treatment Layer>

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 2.2 A/dm$^2$ and a time of 0.7 second <Heat Resistant Layer of Second Surface Treatment Layer>

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 2.1 A/dm$^2$ and a time of 0.7 second Example 5

A surface treated copper foil was obtained in the same manner as in Example 1 except that the formation conditions of the heat resistant layers of the first surface treatment layer and the second surface treatment layer were changed as follows.

<Heat Resistant Layer of First Surface Treatment Layer>

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 3.3 A/dm$^2$ and a time of 0.7 second <Heat Resistant Layer of Second Surface Treatment Layer>

The heat resistant layer was formed by electroplating.

Plating solution composition: 23.5 g/L of Ni and 4.5 g/L of Zn

Plating solution pH: 3.6

Plating solution temperature: 40° C.

Electroplating condition: current density of 2.1 A/dm² and a time of 0.7 second

Example 6

A surface treated copper foil was obtained in the same manner as in Example 1 except that the formation conditions of the heat resistant layers of the first surface treatment layer and the second surface treatment layer were changed as follows.
<Heat Resistant Layer of First Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 3.8 A/dm² and a time of 0.7 second
<Heat Resistant Layer of Second Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 2.1 A/dm² and a time of 0.7 second Comparative Example 1

A surface treated copper foil was obtained in the same manner as in Example 1 except that the formation conditions of the heat resistant layers of the first surface treatment layer and the second surface treatment layer were changed as follows.
<Heat Resistant Layer of First Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 1.7 A/dm² and a time of 0.7 second
<Heat Resistant Layer of Second Surface Treatment Layer>
The heat resistant layer was formed by electroplating.
Plating solution composition: 23.5 g/L of Ni and 4.5 g/L of Zn
Plating solution pH: 3.6
Plating solution temperature: 40° C.
Electroplating condition: current density of 2.1 A/dm² and a time of 0.7 second The surface treated copper foils obtained in Examples and Comparative Example above were subjected to the following evaluations.
<Measurement of Deposited Amounts of Elements in First Surface Treatment Layer and Second Surface Treatment Layer>
The deposited amounts of Ni, Zn, and Co were measured in such a manner that the surface treatment layer was dissolved in nitric acid having a concentration of 20 mass %, and subjected to quantitative analysis by the atomic absorption method with an atomic absorption spectrometer produced by Varian, Inc. (Model AA240FS). The deposited amount of Cr was measured in such a manner that the surface treatment layer was dissolved in hydrochloric acid having a concentration of 7 mass %, and subjected to quantitative analysis by the atomic absorption method in the same manner as above.

<Measurement of L* of First Surface Treatment Layer of Surface Treated Copper Foil>
L* of CIE L*a*b* color space was measured according to JIS Z8730:2009 with MiniScan (registered trade name) EZ Model 4000L, produced by Hunter Associates Laboratory, Inc. as a measuring equipment. Specifically, the first surface treatment layer of the surface treated copper foil obtained in Examples and Comparative Examples was pressed on the sensor of the measuring equipment to cut off external light, and L* thereof was measured. The measurement of L* was performed according to the geometric condition C of JIS Z8722. The major set condition in the measuring equipment was as follows.
Optical system: d/8°, integrating sphere size: 63.5 mm, observation light source: D65
Measurement method: reflection
Illumination diameter: 25.4 mm
Measurement diameter: 20.0 mm
Measurement wavelength and interval: 400 to 700 nm, 10 nm
Light source: pulse xenon lamp, one pulse per measurement
Traceability standard: calibration according to National Institute of Standards and Technology (NIST) based on CIE 44 and ASTM E259
Standard observer: 10°
The white tile as the measurement reference had the following object color.
X: 81.90, Y: 87.02, Z: 93.76 in CIE XYZ color space measured at D65/10° (corresponding to L*: 94.8, a*: −1.6, b*: 0.7 in CIE L*a*b* color space)
<Measurement of Sa of Second Surface Treatment Layer of Surface Treated Copper Foil>
The surface roughness Sa of the second surface treatment layer of the surface treated copper foil was measured according to ISO-25178-2:2012 with a laser microscope (LEXT OLS4000), produced by Olympus Corporation. The environmental temperature in the measurement of the surface roughness Sa with the laser microscope was from 23 to 25° C. The major set condition in the laser microscope was as follows, and the number of measurement was 1.
Objective lens: MPLAPON 50LEXT (magnification: 50, numerical aperture: 0.95, immersion medium: air, mechanical tube length: ∞, cover glass thickness: 0, field number: FN18)
Optical zoom magnification: 1
Scanning mode: high precision in XYZ (height resolution: 10 nm)
Image capture size (number of pixels): 257 μm crosswise×258 μm lengthwise (1024×1024) (corresponding to 257 μm as evaluation length in measurement in crosswise direction)
DIC: off
Multilayer: off
Laser intensity: 100
Offset: 0
Confocal level: 0
Beam diameter limiting: off
Image average: 1
Noise reduction: on
Brightness unevenness correction: on
Optical noise filter: on
Cutoff: none (none in all λc, λs, λf)
Filter: Gaussian filter
Noise removal: premeasurement
Tilt correction: performed <Evaluation of Soldering Heat Resistance>

A polyimide substrate (Upilex (trade name), produced by Ube Industries, Ltd.) was laminated on the second surface treatment layer of the surface treated copper foil and subjected to thermocompression bonding at 300° C. for 1 hour, so as to produce a copper clad laminate.

The copper clad laminate was placed in a thermostat chamber and preliminarily heated to 200° C. for 30 minutes, and then the test was performed by floating on a solder bath having housed therein solder containing 96.5 mass % of Sn, 3 mass % of Ag, and 0.5 mass % of Cu. In this test, the surface treated copper foil was brought in contact with the solder at 330° C. for 3 minutes. In this evaluation, a specimen with a defect (which was a portion where the polyimide substrate was exposed due to melting of the surface treated copper foil) having a diameter of 3 mm or more observed was evaluated as "poor", and a specimen without the defect observed was evaluated as "good".

<Evaluation of Etching Factor (EF)>

A polyimide substrate was laminated on the second surface treatment layer of the surface treated copper foil and subjected to thermocompression bonding at 300° C. for 1 hour, so as to produce a copper clad laminate. A photosensitive resist was coated on the first surface treatment layer of the surface treated copper foil, and then exposed and developed to form a resist pattern having widths L/S=29 μm/21 μm. Thereafter, the exposed portion (i.e., the unnecessary portion) of the surface treated copper foil was removed by etching, so as to provide a printed circuit board having a copper circuit pattern having widths L/S=25 μm/25 μm. The widths L and S of the circuit pattern were the widths of the bottom of the circuit, i.e., the surface thereof in contact with the polyimide substrate. The etching was performed by spray etching under the following condition.

Etching solution: copper chloride etching solution (copper(II) chloride dihydrate: 400 g/L, 35% hydrochloric acid: 200 mL/L)

Solution temperature: 45° C.

Spray pressure: 0.18 MPa

Subsequently, the circuit pattern formed was observed with SEM, and the etching factor (EF) was obtained according to the following expression.

$$EF = (\text{circuit height})/((\text{circuit bottom width} - \text{circuit top width})/2)$$

A larger value of the etching factor means a larger tilt angle of the side wall of the circuit.

The value of EF was an average value of the results of five experiments for each of Examples and Comparative Example.

The evaluation results are shown in Tables 1 and 2.

TABLE 2

|  | L* | Sa (μm) | Soldering heat resistance | EF |
|---|---|---|---|---|
| Example 1 | 81.64 | 0.17 | good | 4.1 |
| Example 2 | 81.49 | 0.15 | good | 4.0 |
| Example 3 | 81.47 | 0.20 | good | 3.7 |
| Example 4 | 83.39 | 0.16 | good | 4.2 |
| Example 5 | 80.03 | 0.24 | good | 3.8 |
| Example 6 | 78.73 | 0.17 | good | 3.6 |
| Comparative Example 1 | 84.73 | 0.15 | poor | 3.9 |

As shown in Tables 1 and 2, Examples 1 to 6 each having L* of the first surface treatment layer of 44.0 to 84.0 exhibited good soldering heat resistance, whereas Comparative Example 1 having L* of the first surface treatment layer outside the scope was insufficient in soldering heat resistance. Examples 1 to 6 exhibited a high etching factor.

It is understood from the aforementioned results that one or more embodiments of the present application can provide a surface treated copper foil and a copper clad laminate that are capable of forming a circuit pattern excellent in soldering heat resistance. Furthermore, one or more embodiments of the present application can also provide a printed circuit board that has a circuit pattern excellent in soldering heat resistance.

One or more embodiments of the present application may also be in the following embodiments.

<1>

A surface treated copper foil including
a copper foil, and
a first surface treatment layer formed on one surface of the copper foil,
wherein the first surface treatment layer has L* of a CIE L*a*b* color space of 44.0 to 84.0.

<2>

The surface treated copper foil according to the item <1>, wherein the L* of the first surface treatment layer is from 74.0 to 84.0.

<3>

The surface treated copper foil according to the item <1> or <2>, wherein the first surface treatment layer has a Zn deposited amount of 200 to 600 μg/dm².

<4>

The surface treated copper foil according to any one of the items <1> to <3>, wherein the first surface treatment layer has a Cr deposited amount of 10 μg/dm² or more.

<5>

The surface treated copper foil according to any one of the items <1> to <4>, wherein the first surface treatment layer has a Ni deposited amount of 30 to 200 μg/dm².

TABLE 1

|  | First surface treatment layer | | | Second surface treatment layer | | | |
|---|---|---|---|---|---|---|---|
|  | Deposited amount of Ni (μg/dm²) | Deposited amount of Zn (μg/dm²) | Deposited amount of Cr (μg/dm²) | Deposited amount of Ni (μg/dm²) | Deposited amount of Zn (μg/dm²) | Deposited amount of Co (μg/dm²) | Deposited amount of Cr (μg/dm²) |
| Example 1 | 67 | 321 | 22 | 65 | 256 | 0 | 50 |
| Example 2 | 67 | 321 | 22 | 93 | 419 | 0 | 48 |
| Example 3 | 67 | 321 | 22 | 146 | 615 | 0 | 50 |
| Example 4 | 44 | 251 | 21 | 77 | 346 | 0 | 50 |
| Example 5 | 93 | 375 | 22 | 77 | 346 | 0 | 50 |
| Example 6 | 110 | 416 | 21 | 77 | 346 | 0 | 50 |
| Comparative Example 1 | 40 | 185 | 25 | 77 | 346 | 0 | 50 |

<6>

The surface treated copper foil according to any one of the items <1> to <5>, wherein the surface treated copper foil further includes a second surface treatment layer formed on the other surface of the copper foil.

<7>

The surface treated copper foil according to the item <6>, wherein the second surface treatment layer has a Ni deposited amount of 20 to 200 µg/dm².

<8>

The surface treated copper foil according to the item <6> or <7>, wherein the second surface treatment layer has a Zn deposited amount of 20 to 1,000 µg/d m².

<9>

The surface treated copper foil according to any one of the items <6> to <8>, wherein the second surface treatment layer has a surface roughness Sa of 0.05 to 0.40 µm.

<10>

A copper clad laminate including the surface treated copper foil according to any one of the items <1> to <9>, and an insulating substrate adhered to a surface of the surface treated copper foil opposite to the first surface treatment layer.

<11>

The copper clad laminate according to the item <10>, wherein the insulating substrate is adhered to the second surface treatment layer.

<12>

A printed circuit board including a circuit pattern formed by etching the surface treated copper foil of the copper clad laminate according to the item <10> or <11>.

REFERENCE SIGN LIST

1 Surface treated copper foil
2 Copper foil
3 First surface treatment layer
4 Second surface treatment layer
10, 20 Copper clad laminate
11 Insulating substrate
30 Resist pattern

The invention claimed is:

1. A surface treated copper foil comprising
a copper foil,
a first surface treatment layer formed on one surface of the copper foil,
wherein the first surface treatment layer comprises a Zn deposited amount of 200 to 600 µg/dm²,
a Cr deposited amount of 10 µg/dm² or more,
and a Ni deposited amount of 30 to 200 µg/dm², and
a second surface treatment layer to be adhered to an insulating substrate, formed on the other surface of the copper foil,
wherein the first surface treatment layer comprises L* of a CIE L*a*b* color space of 44.0 to 84.0,
and the second surface treatment layer comprises a surface roughness Sa of 0.05 to 0.40 µm.

2. The surface treated copper foil according to claim 1, wherein the L* of the first surface treatment layer is from 74.0 to 84.0.

3. The surface treated copper foil according to claim 1, wherein the first surface treatment layer comprises a Cr deposited amount of 10 µg/dm² or more.

4. The surface treated copper foil according to claim 1, wherein the first surface treatment layer comprises a Ni deposited amount of 30 to 200 µg/dm².

5. The surface treated copper foil according to claim 1, wherein the second surface treatment layer comprises a Ni deposited amount of 20 to 200 µg/dm².

6. The surface treated copper foil according to claim 1, wherein the second surface treatment layer comprises a Zn deposited amount of 20 to 1,000 µg/dm².

7. A copper clad laminate comprising
the surface treated copper foil according to claim 1, and
an insulating substrate adhered to the second surface treatment layer of the surface treated copper foil.

8. A printed circuit board comprising a circuit pattern formed by etching the surface treated copper foil of the copper clad laminate according to claim 7.

* * * * *